United States Patent [19]

Benes et al.

[11] Patent Number: 5,051,599

[45] Date of Patent: Sep. 24, 1991

[54] DEVICE FOR RECOGNIZING THE IMPACT SITE OF A CHARGE CARRIER BEAM ON A TARGET

[75] Inventors: Ewald Benes, Biedermannsdorf; Martin Gröschl; Michael Schmid, both of Wien, all of Austria; Hans-Joachim Siegmund, Babenhausen, Fed. Rep. of Germany; Friedrich-Werner Thomas, Gelnhausen, Fed. Rep. of Germany; Gernot Thorn, Hanau, Fed. Rep. of Germany

[73] Assignee: Leybold Aktiengesellschaft, Fed. Rep. of Germany

[21] Appl. No.: 470,857

[22] Filed: Jan. 26, 1990

[30] Foreign Application Priority Data

Jan. 26, 1989 [DE] Fed. Rep. of Germany ....... 3902274

[51] Int. Cl.$^5$ .......................................... G01N 23/225
[52] U.S. Cl. .................................. 250/491.1; 250/397; 250/310; 378/189; 219/121.23; 219/121.28
[58] Field of Search ...................... 250/491.1, 397, 310, 250/370.10, 370.15; 378/189; 219/121.28, 121.23

[56] References Cited

U.S. PATENT DOCUMENTS

| 3,324,813 | 7/1967 | Hashimoto | 250/310 |
| 4,831,639 | 5/1989 | Harke | 250/370.15 |
| 4,843,246 | 6/1989 | Benes et al. | 250/397 |

Primary Examiner—Jack I. Berman
Attorney, Agent, or Firm—Killworth, Gottman, Hagan & Schaeff

[57] ABSTRACT

The invention relates to a device for recognizing the impact site (29, 37) of a charge carrier beam on a target. This device has two position-sensitive detectors (22, 23) above the target which have a given distance from each other and from the target and on which via imaging systems (24, 25) the impact site (29, 37) of the charge carrier beam is imaged by means of X-rays. The output signals of these detectors (22, 23) are placed on a special evaluation device which determines all three spatial coordinates of the impact site (29, 37) of the charge carrier beam.

26 Claims, 5 Drawing Sheets

DEVICE FOR RECOGNIZING THE IMPACT SITE OF A CHARGE CARRIER BEAM ON A TARGET

BACKGROUND OF THE INVENTION

The present invention relates to a device for recognizing the impact site of a charge carrier beam.

Devices of this type are used in particular with electron beam vaporizer sources, melting installations, and welding guns. In the case of all of these installations it is important to guide the electron beam precisely. So for example in the electron beam vaporizer sources the electron beam is moved over the surface of the material to evaporate in such manner that on a given area the most uniformly possible surface temperature is achieved and hence an evaporation rate which is constant over this area. To make possible precise guidance of the electron beam which can be deflected through electrical and/or magnetic fields, it is required that the actual position is precisely known.

For the determination of the actual position different properties are utilized which the impact site of the electron beam on a material has. One of these characteristics consists in that the target material at the impact site melts while it is still solid in other places. Other characteristics are the increased emission of UV light at the impact site and the emission of X-rays which are generated in the deceleration of electrical particles.

For the monitoring of the beam impact area in particle beam working equipment an arrangement is already known which has a control beam path for a bundle of the particle and/or X-ray beams emitted by the beam impact area, wherein the control beam path has an imaging system for imaging the beam impact area as well as an radiation receiver arranged in the image area of the imaging system (DE-AS 12 99 498). However, with this known arrangement it is not possible to obtain a precise coordinate specification of the impact site of the electron beam on a target because the effective area of the radiation receiver is smaller than the area of the image of the beam impact area generated by the imaging system at optimum focussing of the working particle beam, i.e. the entire radiation receiver is covered by the imaged beam impact area.

A device for recognizing the impact site of a charge carrier beam on a target, in which the impact area of the electron beam imaged on a sensor by an imaging system is smaller than the sensor, is also known (EP-0 184 680 A1). Herein an imaging system is provided which detects all positions which the impact site can assume and images them on the sensor surface of a position-sensitive detector. It is of disadvantage in this known device that the actual position signal is falsified by potentially occurring level changes of the melt material, i.e. the determined x,y-coordinates of the impact site are influenced by changing the z-coordinate. In large sputtering installations which represent the preferred application field of this known position sensor, the shortest distance of the detector and the diaphragm from the target surface is generally great in relation to the maximum height change of the melt material surface so that the deviation of the indicated from the actual x,y-coordinates brought about by this level change is negligibly small.

In smaller sputtering installations electron beams of lower power are generally used. Therefrom results a significantly lesser intensity of the X-radiation which can be utilized for the position detection. In such installations the position detectors must therefore be disposed at a significantly shorter distance from the target surface. Also, the distance between the target surface and the positioning detector is necessarily small due to construction limitations. But therewith due to the other imaging scale a change of the z-coordinate of the beam impact point—even at constant x,y-coordinates—effects a shift of the picture point on the detector surface which is no longer negligible. The position detector according to EP-0 184 680 A1 is therefore less suitable for small installations in which the melt bath level is variable.

Level changes as such could be detected with the aid of distance measuring devices such as are used for example in a modern autofocus camera. Such distance measuring devices however permit no detection of the x-and y-coordinates.

SUMMARY OF THE INVENTION

The invention is therefore based on the task of obtaining an actual position signal of the impact point of an electron beam on a target which is independent of the melt material level.

This task is solved according to the features of the present invention.

The advantage achieved with the present invention consists in particular in that the exact position of the impact site of an electron beam on the surface of a target can be determined even if the level of the melt material changes which is of significance with all vaporizer installations in which no continuous feed of material occurs during the vaporization process. Moreover with the impact position of the electron beam on the target surface the level of the crucible can also simultaneously be monitored and hence a burning-in of the electron beam into the bottom of the crucible can be prevented. Furthermore, with the present invention the determination of all three spatial coordinates of the impact site of the electron beam in different systems of coordinates (for example Cartesian coordinates, polar coordinates, spherical coordinates) is possible. The impact site of the charge carrier beam is understood to be the location of the center of gravity of the power density distribution of the charge carrier impinging on the target surface.

It is also possible with the present invention to determine precisely the coordinates of the impact site—thus including the z-coordinate—even if the detectors are disposed near the target surface. A change of any coordinate no longer has any influence on the others, i.e. the non-correlated determined coordinates. In a series of application cases a precise determination of the beam position at all points of the target surface is not required, but rather only fixing the impact area in the center of the target surface is desired. For these cases a simplified version of the invention in the form of a center-position sensor can be applied. In contrast to known position sensors this simplified version also permits the precise determination of—even of only a single—a distinct position, for example the center position, even if the the melt material level and hence the z-coordinate of the impact point changes.

An embodiment example of the present invention is represented in the drawing and is described in greater detail below.

DETAILED DESCRIPTION OF THE INVENTION

Figure 1A:
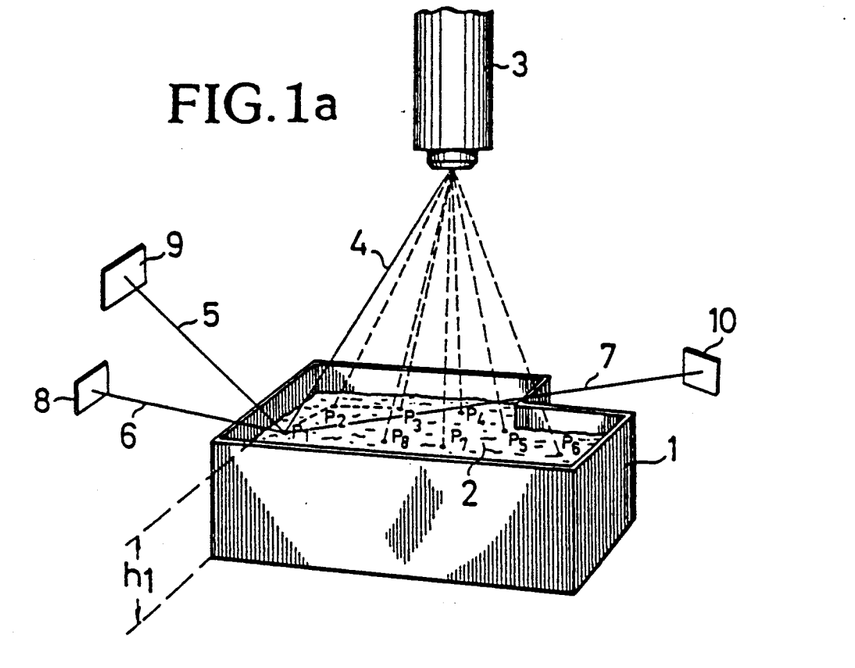
FIG. 1a is a crucible and an electron beam gun wherein the melt material in the crucible has a high level.
Figure 1B:
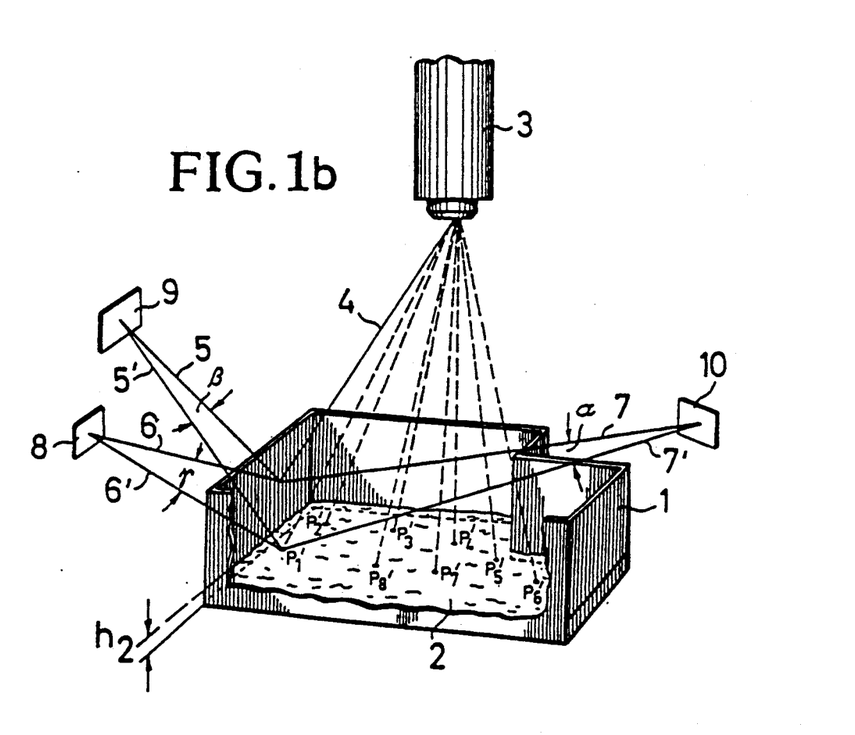
FIG. 1b is the same arrangement as in FIG. 1a however with low melt material level.

In Fig. 1a a crucible 1 with melt material 2 is shown above which an electron beam gun 3 is disposed. This electron beam gun 3 sends out an electron beam 4 to the surface of the melt material 2, whereby at point $P_1$ X-rays 5, 6, 7 are generated which are detected by sensors 8, 9, 10. Through deflection devices (not shown) the electron beam 4 can be deflected in different directions, so that it impinges for example on points $P_2$ to $P_8$ on the surface of the melt material. The X-rays are subsequently emitted accordingly from the points $P_2$ to $P_8$. The level of the melt material 2 relative to the bottom area of the crucible 1 is denoted in the FIG. 1a by $h_1$. With the device described in EP0 184 680 which provides as sensors 8, 9, 10 for example lateral diodes, the particular positions $P_1$ to $P_8$ can be given precisely according to x- and y-coordinates, and independently of the particular intensity of the electron beam 4. However if the level changes, such as decreasing to the level $h_2$, then the impact points $P_1 \ldots P_8$ are located at different x-/y-coordinates. The electron beam 4 which in FIG. 1a impinged on point $P_1$ on the surface of the melt material, with the lowered surface in FIG. 1b no longer impinges on the melt material 2 at all. The impact point $P_1'$ which with respect to its surface x-/y-coordinates corresponds to the impact point $P_1$, now emits X-rays 5', 6', 7' in directions which with the earlier directions and relative to the sensors 8, 9, 10 form angles α, β, γ. With the arrangement shown in FIGS. 1a and 1b and an electric evaluation circuit for position-sensitive radiation detectors, as are for example described in EP-0 184 680, the x- and y-coordinates of the impact point of a charge carrier beam on a target can only be determined exactly if the distance of the sensors from the surface of the melt material remains constant. If one wants to avoid the influence of a level change of the melt material on the x-/y-coordinates in the arrangement according to EP-0 184 680 then one would have to move the sensors along with the level change of the melt material. This would however, apart from the additional expenditure for the motion of the sensors, require the determination of the z-coordinate of the impact point of the charge carrier beam, which determination is independent of the x- and y-coordinates. But this independent determination of the z-coordinate is not possible with the described arrangement since a position-sensitive detector disposed in any given position above the target supplies signals which depend on at least two coordinates of the impact point of the charge carrier beam.

Figure 2:
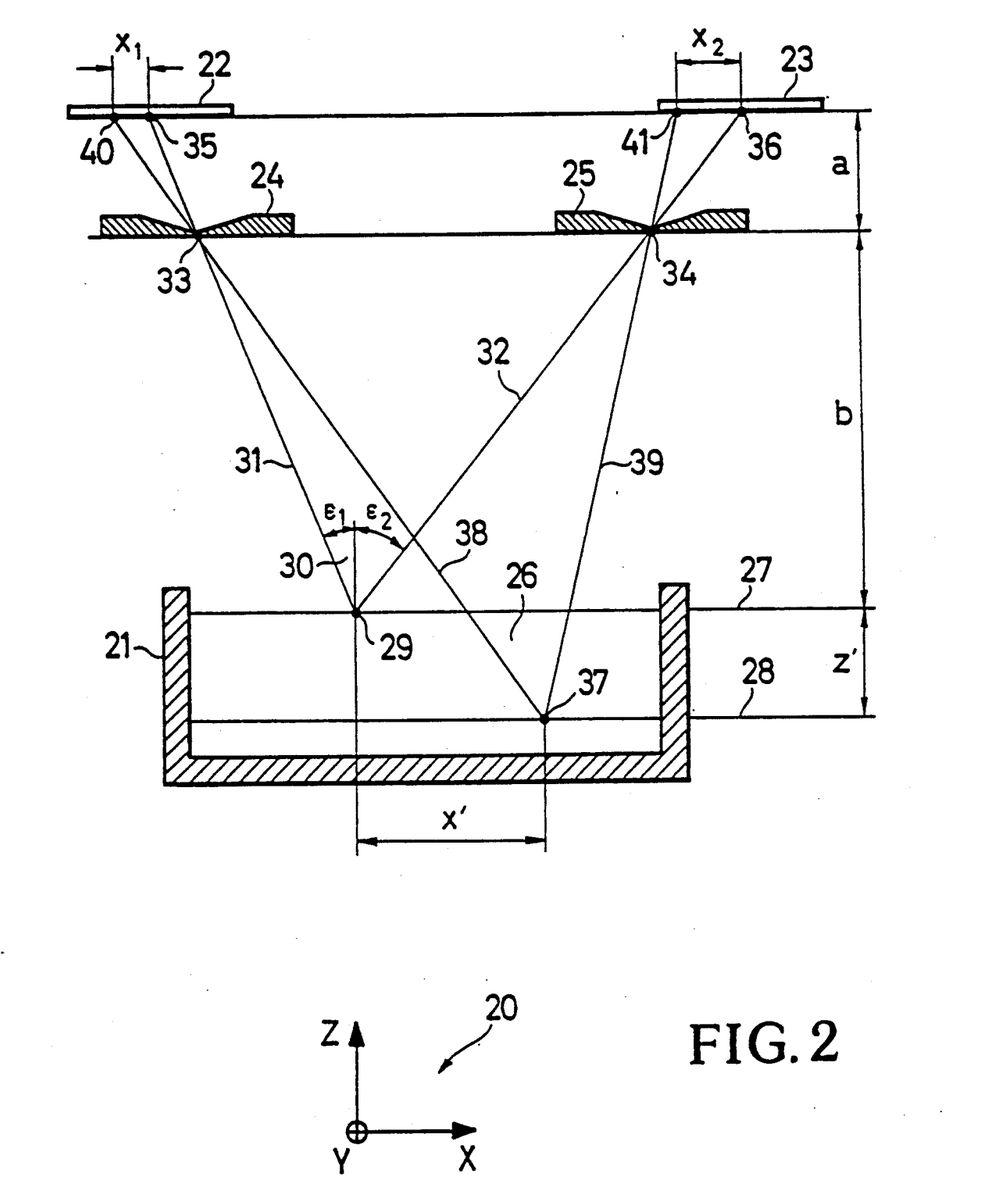
FIG. 2 is the principle of an arrangement according to the present invention for the determination of the three spatial coordinates x, y, and z of the impact point of a charge carrier beam on a target.

In FIG. 2 is represented the principle of the device according to the present invention for the determination of the spatial coordinates of the impact point of a charge carrier beam on a target. The representation takes place herein with the aid of the Cartesian coordinates according to the x,y,z-assignment 20. The x- and z-axes lie in the plane of the drawing while the y-axis projects from the plane of the drawing. A crucible, which is represented in cross section, is denoted by 21. Above the crucible 21 are disposed two position-sensitive sensors 22, 23 as well as two pinhole diaphragms 24, 25. The pinhole diaphragms 24, 25 herein are disposed between the crucible 21 and the sensors 22, 23. The radiation-sensitive surfaces of the sensors 22, 23 directed onto a target 26 lie parallel to the X-Y plane. The sensors 22, 23 have position-sensitivities along the axes X and Y. A straight line 27 denotes the intersection line of the surface of target 26, which is for example melt material at a given point in time $t_1$ with the X-Z plane.

Another straight line 28 denotes the intersection line of the surface of the target 26 to the X-Z plane at another point in time $t_2$. Point 29 is an arbitrarily selected fixed reference point on the target surface 27 at time $t_1$. From this reference point 29 two straight lines 31, 32 extend at angles $\epsilon_1$ or $\epsilon_2$ respectively relative to an imaging surface normal 30 through apertures 33, 34 of the diaphragms 24, 25. These straight lines 31, 32 impinge on the points 35, 36 on the X-ray-sensitive surfaces of the sensors 22, 23. Point 37 denotes the impact location of a not represented charge carrier beam on the target 26 at time $t_2$. From this point 37 which has the coordinates x' and z' relative to point 29 extend two straight lines 38, 39 which indicate the course of the generated X-rays and impinge on the points 40, 41 on the sensors 22, 23. The distance of the diaphragm apertures 33, 34 to the sensors 22, 23, measured in the direction of the z-axis, is denoted with a, and the distance from the diaphragm apertures 33, 34 to the melt material surface 27 at time $t_1$ is identified with b.

If the impact location of the charge carrier beam is shifted on the melt material from point 29 to point 37 the sensor 22 registers on its surface a shift of the X-rays along the x-axis by the distance $x_1$ while the sensor 23 detects a shift by the distance $x_2$. Based on geometric considerations with the aid of the ray theorem follows the relation $$\frac{x_1}{x' - z'\tan\epsilon_1} = \frac{a}{b + z'} \qquad (I)$$

or $$x_1 = \frac{a}{b + z'}(x' - z'\tan\epsilon_1) \qquad (II)$$

Analogously in view of the distance $x_2$ the equation applies $$\frac{x_2}{x' + z'\tan\epsilon_2} = \frac{a}{b + z'} \qquad (III)$$

or $$x_2 = \frac{a}{b + z'}(x' - z'\tan\epsilon_2) \qquad (IV)$$

By subtraction of equation (II) from equation (IV) is obtained $$x_2 - x_1 = \frac{az'}{b+z'}(\tan\epsilon_1 + \tan\epsilon_2) \quad (V)$$

and therefrom by conversion $$z' = b\frac{(x_2 - x_1)}{k_1 a - (x_2 - x_1)} \quad (VI)$$

with $k_1 = \tan\epsilon_1 + \tan\epsilon_2 = $ const.

Through the addition of the equations (II) and (IV) is obtained $$x_2 + x_1 = \frac{a}{b+z'}[2x' + z'(\tan\epsilon_2 - \tan\epsilon_1)] \quad (VII)$$

If the reference point 29 is so selected that $\epsilon_1 = \epsilon_2$, it follows from equation (VII)

$$x_2 + x_1 = \frac{2ax'}{b+z'} \quad (VIII)$$

Through conversion of equation (VIII) is obtained $$x' = \frac{b}{2a}(x_2 + x_1) + \frac{1}{2a}(x_2 + x_1)z' \quad (IX)$$

with $\epsilon_1 = \epsilon_2$.

In analogy to equation (IX) is obtained for the y-coordinate $$y' = \frac{b}{2a}(y_2 + y_1) + \frac{1}{2a}(y_2 + y_1)z' \quad (X)$$

for $\delta_1 = \delta_2$.

if the y-coordinate of point 37 relative to point 29 is identified by y', with $y_1$ and $y_2$ the y-coordinates of points 40 or 41 respectively relative to the points 35 or 36 respectively and with $\delta_1$ and $\delta_2$ the angles in the Y-Z plane corresponding to the angles $\epsilon_1$ or $\epsilon_2$ respectively.

By using the position-proportional signals of sensors 22 and 23 in equation (VI), the z-coordinate of the impact point of the charge carrier beam on the target can be determined, and knowing this z-coordinate the x- and y-coordinates can be determined from equations (IX) and (X). The required calculations can be carried out for example with the aid of a microcomputer.

In many cases the distance (a+b) of the detectors 22, 23 from the surface 27 of the target is significantly greater than the maximum level shift $z'_{max}$ of the melt material. The equations (II) and (IV) can then be written as follows:

$$x_1 = \frac{a}{b}(x' - z''\tan\epsilon_1) \text{ for } b >> z' \quad (XI)$$

$$x_2 = \frac{a}{b}(x' - z''\tan\epsilon_2) \text{ for } b >> z' \quad (XII)$$

By subtracting equation (XI) from equation (XII) now follows:

$$z' = k_2(x_2 - x_1) \text{ mit } k_2 = \frac{b}{a(\tan\epsilon_1 + \tan\epsilon_2)} = \text{const.} \quad (XIII)$$

By addition of equations (XI) and (XII) results $$x' = \frac{b}{2a}(x_1 + x_2) \text{ for } \epsilon_1 = \epsilon_2 \quad (XIV)$$

Analogously for the y-coordinate $$y' = \frac{b}{2a}(y_1 + y_2) \text{ for } \delta_1 = \delta_2 \quad (XV)$$

With the aid of equations (XIII) to (XV) the coordinates of the impact point of a charge carrier beam on a target can be determined from the signals of the position-sensitive sensors 22, 23 as a first approximation in simple manner for example with the aid of an analog circuit.

Figure 3:
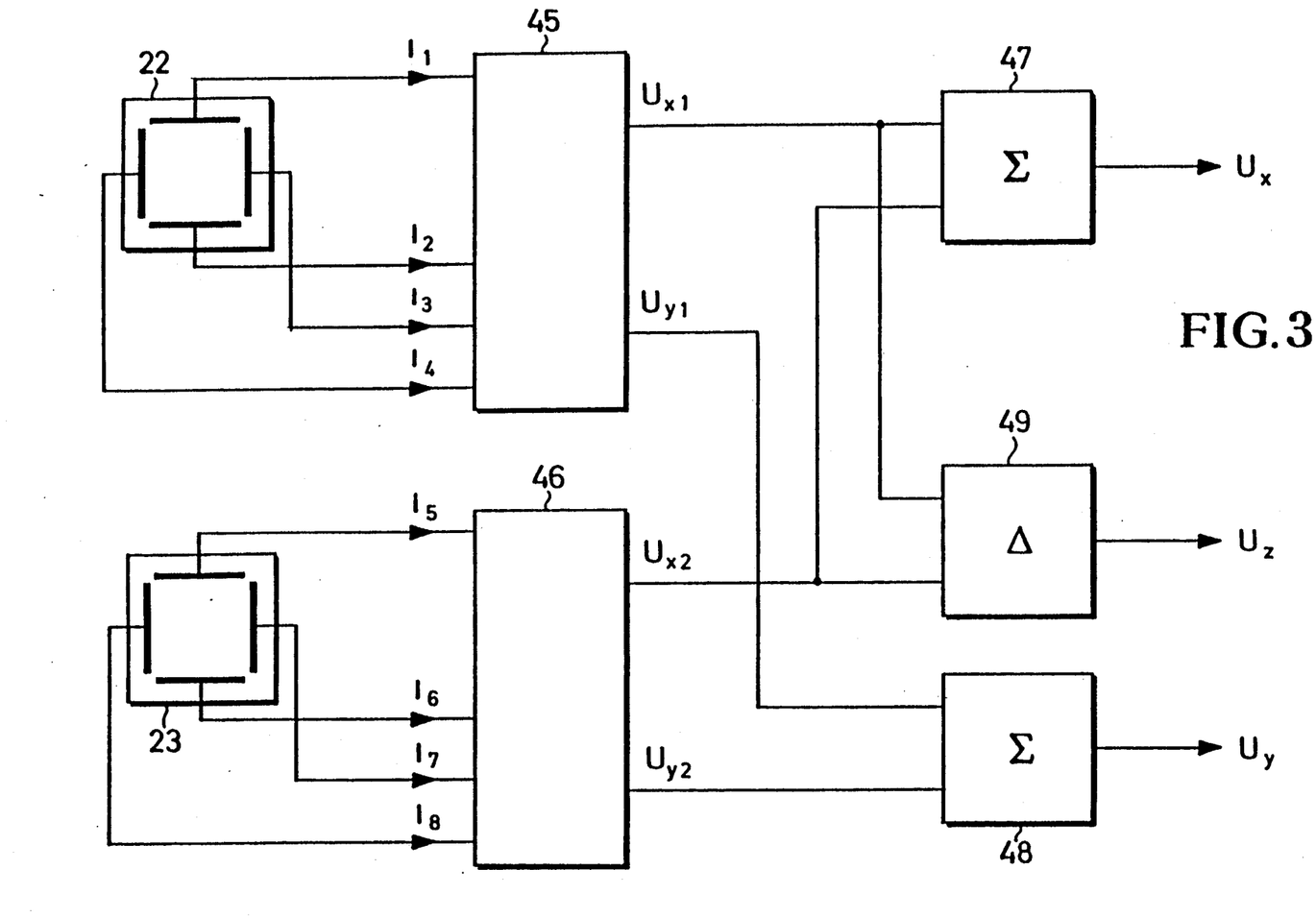
FIG. 3 is an evaluation circuit for a position detector according to the invention.

An embodiment example of an evaluation circuit for a position detector according to the invention is shown in FIG. 3 and is described below in greater detail.

The position and intensity dependent currents $I_1$ to $I_8$ formed by the bidirectional position-sensitive photosensors 22 and 23 are first converted by evaluation circuits 45 and 46 respectively into the position-proportional electric voltages $U_{x1}$, $U_{y1}$ and $U_{x2}$, $U_{y2}$ respectively. Therein $U_{x1}$ is proportional to the excursion of the radiation on the sensor 22 in the direction of the x-axis and $U_{y1}$ is proportional to the excursion of the radiation on the sensor 22 in the direction of the y-axis. The like is true for the voltages $U_{x2}$ and $U_{y2}$ with respect to the sensor 23. An evaluation circuit 45, 46 as can be used here is represented for example in the FIGS. 5 and 6 of the EP-0 184 680. There the difference of each pair of sensor currents is divided by their sums. According to the present invention from the position-proportional voltages $U_{x1}$, $U_{y1}$, $U_{x2}$, $U_{y2}$ via electronic addition circuits 47, 48 or a subtraction circuit 49 voltages $U_x$, $U_y$, $U_z$ are obtained which in each instance depend exclusively from the coordinates x or y or z respectively of the impact point of the charge carrier beam on the target. The linkage takes place according to the equations (XIII) to (XV). It applies $$U_x \alpha (U_{x1} + U_{x2}) \quad (XVI)$$
$$U_y \alpha (U_{y1} + U_{y2}) \quad (XVII)$$
$$U_z \alpha (U_{x1} - U_{x2}) \quad (XVIII)$$

The thus generated position-proportional voltages $U_x$ and $U_y$ can be included as regulating variables for the regulation of the impact position of an electron beam on a target in electron beam vaporizer installations, wherein the actual position of the beam is correctly detected even if the level of the melt material shifts. The voltage $U_z$ can be used for monitoring the level of the melt material and can serve in particular as criterion for the point in time when the material to be evaporated is used up or material is to be added to the crucible.

In a number of applications, in particular with small electron beam vaporizer installations, only the determination of the impact site of the electron beam in the center area of the target surface is of interest. This is especially the case if the surface of the target and the cross sectional area of the impinging electron beam are of comparable magnitude. Beyond that the monitoring and regulation of the beam position is often only required along a particular axial direction, since for constructional reasons decisive fluctuations of the electron beam position due to thermal or other effects occur only along a particular axial direction.

If as in the above cited case only the precise recognition and regulation of a distinct position—for example the center position—of the impact point of a charge carrier beam on a target is required, then it suffices to generate a signal which is a constant monotonic function of the impact position and which assumes at the required position a particular value—for example zero. A unique and linear connection between such a signal and the spatial coordinates of each possible beam position is not required in this case. To eliminate the influence of a level change of the melt material on the spatial signal of such a detector—which below will be referred to as "center-position detector"—there can be disposed, according to the present invention, a position-sensitive detector having position-sensitivity along the coordinate axis to be monitored, in such manner above the target that the projection of the axis of symmetry of the detector on the target surface extends exactly through that point on the surface whose position is to be recognized precisely.

The advantage achieved with this arrangement consists in particular therein that every time the electron beam reaches its center position a zero-passage signal independent of the melt material level is generated. An embodiment example for a center-position detector according to the invention is described in greater detail below.

Figure 4:
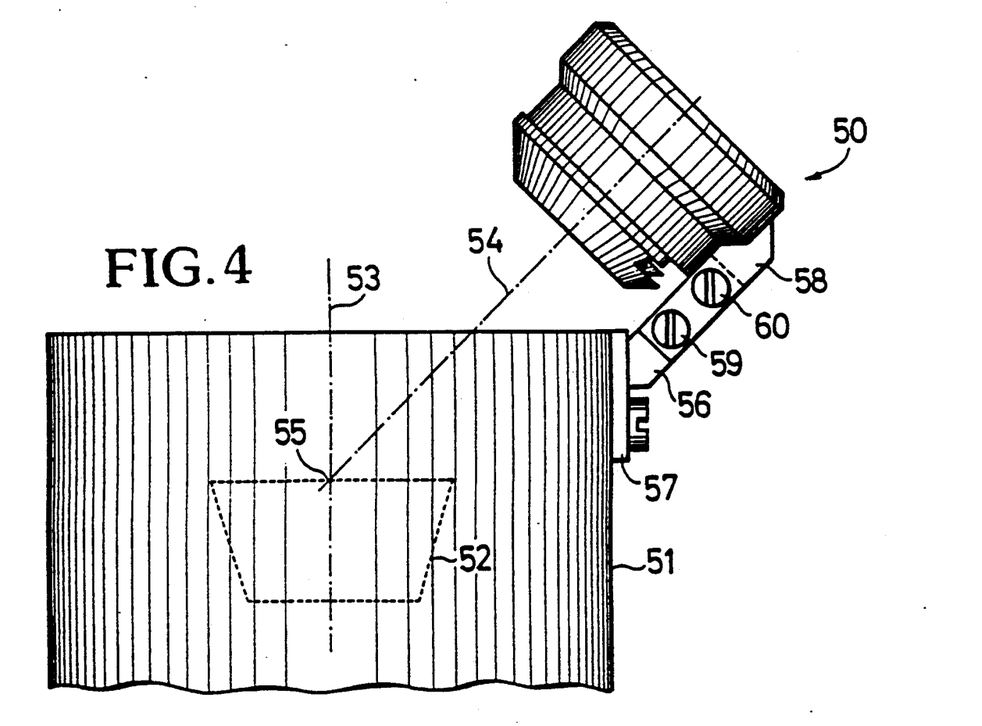
FIG. 4 is an arrangement with an electron beam center-position detector for small installations.

FIG. 4 shows in a projection onto the X-Z plane an electron beam center-position detector 50 according to the invention which is mounted on a vaporizer source 51. The image scale is approximately 1:1. In the vaporizer source 51 is located a crucible 52 represented in dashed lines. Centerline 53 denotes the vertical axis of the crucible 52 which indicates simultaneously the direction of an electron beam impinging on the melt material surface (not shown). The axis of symmetry of the position detector 50 is denoted by 54; it intersects the vertical axis 53 at point 55.

With the aid of a mounting section 56 and a mounting plate 57 the position detector 50 is connected with the vaporizer source 51. The mounting section 56 is securely brazed to the mounting plate 57. A further mounting section 58 connected with the first stated mounting section 56 by two cylinder screws 59, 60 is also securely brazed to the position detector 50.

The position detector 50 operates according to the principle of the "X-ray pinhole camera". Therein the X-radiation emitted by the impact site of the electron beam 4 on the target 2 is imaged with a pinhole diaphragm on a position-sensitive photodetector. The signals supplied by the detector are electronically amplified and further processed.

The arrangement shown in FIG. 4 achieves alignment of the electron beam 53 with to the center of the crucible 52 through the aid of a regulating device wherein only the y-deflection critical with respect to drift is monitored. The position sensor 50 thus supplies a voltage signal which is proportional to the deviation of the electron beam impact point from the center of the crucible wherein averaging takes place over potential rapid beam motions or beam oscillations. The detector geometry is so selected that the center position of the electron beam 53 is correctly recognized independently of the level of the crucible 52.

In operation, the housing of the position sensor 50 together with other regions of the installation are placed in a vacuum. However, the vacuum is not an operating condition for the position detector but only for the electron beam vaporizer itself.

With the arrangement according to FIG. 4 the z-coordinate is not explicitly determined, however its influence on the indicated x-y-coordinates of a distinct position is eliminated. In comparison to the position detector known from EP-0 184 680 A1 the center-position detector can be constructed more cost-effectively because the position signal need not be a linear function of the spatial coordinates over the entire possible impact area of the beam. Also the fact that the described ratio formation and logarithmization of the detector signals can be carried out by means of a single integrated circuit package reduces the cost of the position detector, especially since an analog divider or other relatively expensive structural elements is not required. Moreover, through the logarithmization the advantage of a very high dynamic range is given.

Figure 5:
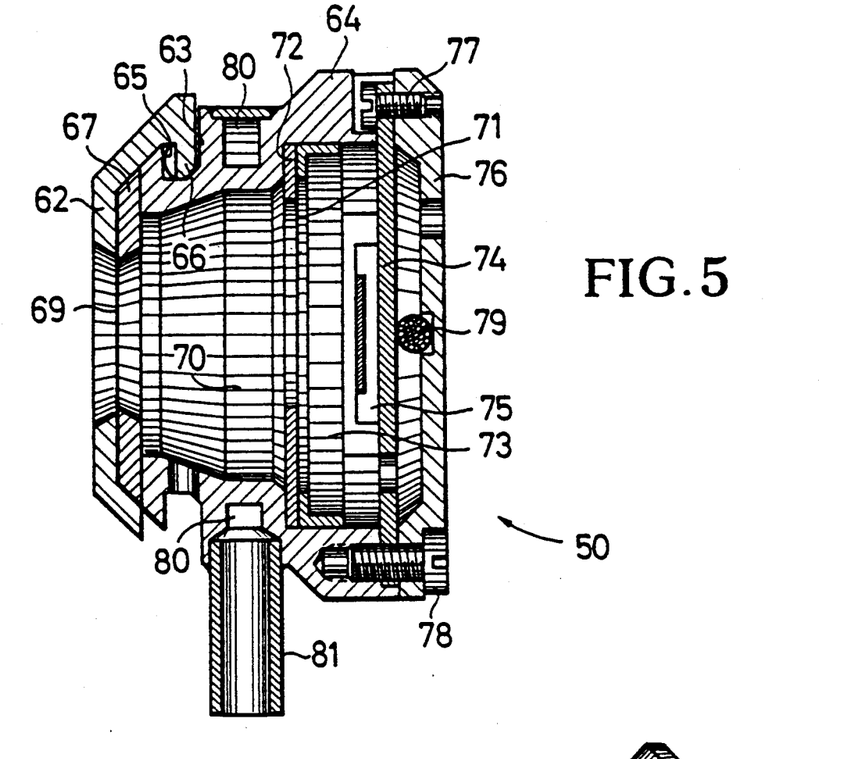
FIG. 5 is a center-position detector shown in section.

In FIG. 5 the position detector 50 is shown in enlarged scale and in section. A protective cap 62 can be recognized which engages a groove 63 on the outer circumference of a housing 64 which is hollow. By means of a leaf spring 65 fastened on a projection 66 of the protective cap 62 herein an diaphragm 67 is pushed against the housing 64. Between the protective cap 62 and the front area of the housing 64 the diaphragm 67 assumes the function of an X-ray pinhole diaphragm. A protective foil 69 is clamped between the diaphragm 67 and the protective cap 62. This protective foil 69 can be a thin aluminum foil which protects the detector proper against vapor-deposition. It can be renewed each time when changing the substrate to avoid too great an intensity attenuation of the X-rays to be detected through the additional layer generated on the foil 69. The inner hollow space 70 of the housing 64 is closed toward the front, thus in the direction toward the entering X-rays, through the protective foil 69, and toward the rear through a further protective foil 71, which is a separation foil which in the event to damage of the foil 69 assumes its protective function. The last-stated protective foil 71 is clamped between a support sheet 72 and a holding device 73. Behind the holding device 73 is located a detector carrier plate 74 with a detector 75. Adjoining this detector carrier plate 74 is a housing cover 76 which is connectable via cylinder screws 78 with the housing 64. Between the housing cover 76 and the housing 64 is clamped the detector carrier plate 74. A rubber bead 79 is disposed in a groove of the housing cover 76 which is located approximately in the center of this cover 76. This rubber bead touches the detector carrier plate 74. About the hollow space 70 of the housing 64 a cooling-water channel 80 is placed which is fed with cooling water of approximately 10° to 25° C. from a copper pipe 81.

The electron beam position sensor 50 can be operated manually or automatically in connection with corresponding evaluation and control electronics.

In manual operation only the monitoring of the beam position and possibly the display of a deviation from the crucible center takes place via an LED row, however there is no position control and no switching-off of the electron beam vaporizer in the event of error.

In automatic operation the position signal supplied by the detector 75 is fed into a power stage for the y-deflection of the electron beam 53 and superimposed on a setting variable for the y-deflection current selected by means of a potentiometer at a remote control.

Figure 6:
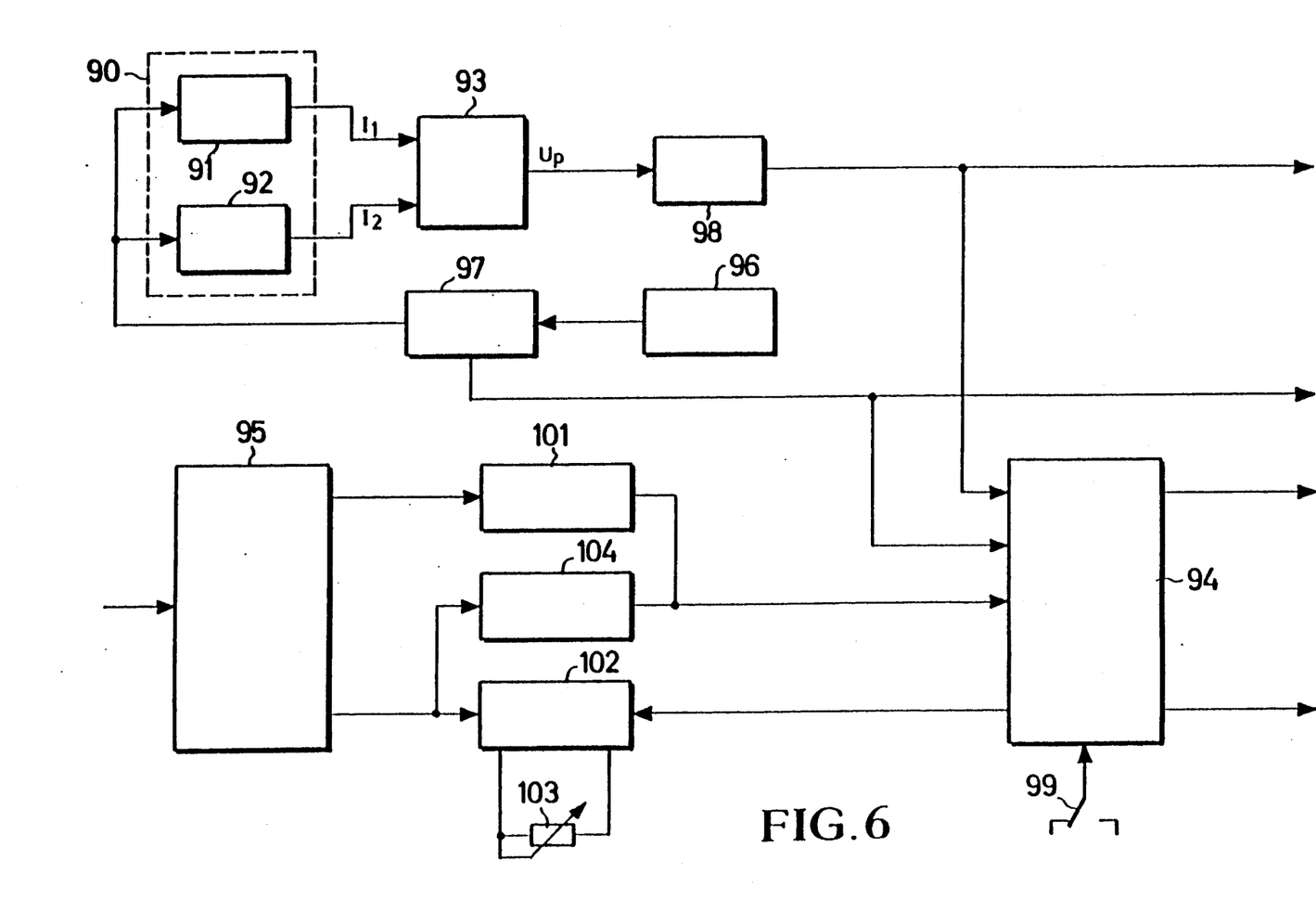
FIG. 6 an evaluation circuit for a center-position detector according to the invention.

How an evaluation circuit for the detector signal can be constructed is shown in FIG. 6.

The position-sensitive detector 90 is formed by two large-area (approximately 10 mm × 10 mm) photodiodes 91, 92 lying adjacent to each other. This represents a particularly cost-effective solution with simultaneously good utilization of the X-rays to be detected. The detector signal proper is formed from the ratio of the current signals of the two photodiodes 91, 92.

Experiments with known silicon photodiodes (for example Siemens BPY 63 P, Hamamatsu S 2387, Hamamatsu S 1227, Hamamatsu S 1723) have shown that in the range of electron beam primary voltages between 6 kV and 12 kV an increase of the X-ray sensitivity with increasing primary energy occurs.

Because of the X-ray yield which strongly depends on the target material used—since multiple X-ray lines are excited the intensity of the X-rays due to the heterogeneous radiation is proportional to the atomic number of the target; additionally characteristic X-ray lines are excited—and because of the different levels of absorption of the radiation in the aluminum protective foil located in front of the detector, markedly different detector signals result for different target materials. Nevertheless, the X-ray intensities even at low acceleration voltages of 6 kV and target materials with low X-ray yield are sufficient to permit even at extremely low emission currents ($\geq$ 10 mA) perfect detection. This is of significance primarily for the realization of an automatic switching-on process of an electron beam vaporizer.

The main task of the evaluation electronics for the photodiodes 91, 92 is the formation of a constant monotonic position signal depending on the location of the radiation impinging on the detector 90, however with the position signal being independent of the radiation intensity. This task can, as described above, be solved through an evaluation circuit 45, 46.

According to the present invention, now instead of using the difference of two currents to produce an intensity-independent position signal the current ratio $I_1/I_2$ or its logarithm is used.

The advantage of the present method lies inter alia in that the the logarithm of the current ratio can be generated with the aid of a single integrated circuit package, for example LOG 100 by Burr Brown, with very low additional circuit expenditure and that as a consequence of the logarithmization an extremely high dynamic range of the order of magnitude $1:10^6$ is achieved without the necessity of a range change-over, which in small electron beam vaporizer installations is of great significance. In FIG. 6 such integrated circuit package 93 is denoted as a logarithmic amplifier. This supplies at its output a voltage signal $U_p$, which fulfills the following functional relationship:

$$U_p = k \log \frac{I_1}{I_2} \quad \text{(XIX)}$$

Wherein k is a constant set through external wiring of the amplifier 93. $I_1$ and $I_2$ are the currents supplied by the photodiodes 91 and 92 respectively. Consequently, the thus generated signal $U_p$ is independent of the total intensity of the X-radiation impinging on the photodiodes, since with a change of the total radiation intensity both detector currents $I_1$ and $I_2$ always change in the same proportions. Every time the position of the impact point of the electron beam lies in the direction of the y-axis in the target center the detector currents $I_1$ and $I_2$ are of identical magnitude and the signal $U_p$ reaches according to equation (XIX) the value zero. Due to the chosen detector arrangement this is the case independent of the z-coordinate of the electron beam, i.e. independent of the melt material level. If the electron beam position shifts along the y-axis, the ratio of the detector currents $I_1$ and $I_2$ changes and the signal $U_p$ assumes positive or negative values—depending on the direction of the shift. These values of the signal $U_p$ are now for reasons of geometry no longer independent of the melt material level, however a change of the z-coordinate can never result in a sign change of $U_p$. Even at a constant z-coordinate the dependency of the signal $U_p$ on the y-coordinate is not linear, yet the deviations in the region of interest are small and can be tolerated in particular if, as is the case here, only the precise determination of the center position is of significance. The generated signal $U_p$ is hence—according to the above defined requirement—a constant monotonic function of the y-coordinate of the impact point of the electron beam and can therefore be drawn on as control criterion for the regulation of the y-coordinate of the electron beam on the target center. A shift of the electron beam position along the X-axis on the target results only in a change of the total X-radiation intensity impinging on both detectors and therefore does not effect a change of signal $U_p$.

The photodiodes 91, 92 are as a rule operated with negative bias voltage. With greater inverse voltage the barrier layer capacitances of the photodiodes 91, 92 decrease whereby their response speed increases. In addition, operation with negative bias voltage result in a precise linear connection between light intensity and photocurrent over a greater range. Therefore the photodiodes 91, 92 in the circuit configuration according to FIG. 6 are operated with a stabilized bias voltage 96. Therein the current flowing into the diodes is measured through a total current measurement 97 and displayed.

The position signal coming from the logarithmic amplifier 93 is placed on an integrator 98 which forms the average over the beam oscillation and outputs a signal which is used as position indication.

Apart from the position recognition proper which is characterized by the blocks 90, 93, 96, 97, 98, the evaluation electronics shown in FIG. 6 have a few additional functions, for example automatization of the switch-on process, emergency switch-off in the event of error etc.

As can be seen in the lower part of the fundamental representation of FIG. 6, with the setting "manual" of switch 99, which acts upon an error recognition circuit 94, only the monitoring of the beam position and potentially the indication of a deviation from the crucible center takes place, however no position regulation and no switch-off is present in the event of error.

In the position "automatic" of switch 99 the position signal supplied by detector 90 coming from the integrator 98 is fed into a (not shown) power end stage for the y-deflection of the electron beam and superimposed on the setting variable for the y-deflection current selected by means of a potentiometer at the remote control or at the deflection control apparatus.

If the beam deflection fails during operation for example in that the electron beam migrates out of the field of view of the detector 90, this is recognized through the error recognition circuit 94 which triggers an emergency switch-off of the electron beam vaporizer. Likewise an exceeding or falling below of the permissible input current level for the logarithmic amplifier 93 is recognized by this error recognition circuit 94 which subsequently likewise triggers an emergency switch-off.

Furthermore a recognition circuit 95 is provided whose task consists in differentiating whether the switching on of the high voltage supply for the electron beam vaporizer is a new switch-on i.e. resumption of operation following an operating break or a switching-on after a brief high voltage interruption, for example due to a spark-over. In the first stated case the emission current is limited through a limiter circuit 102 to approximately 10 to 20 mA until the detector announces the correct positioning of the electron beam. This emission current limitation takes place independently of a value for the emission current preset at the potentiometer 103. If within a suitably selected start-up time determined by a time element 104, the correct beam positioning has not be recognized by the detector 90—for example because a falsely set or erroneous beam deflection is present—a switching-off of the high voltage supply takes place with a corresponding error message.

After a short high voltage interruption, for example after a spark-over, switching on again takes place. If after completion of the switch-on time given by a time element 101 no recognition of the correct beam positioning occurs, a high-voltage switch-off with corresponding error message also occurs.

Having described the invention in detail and by reference to preferred embodiments thereof, it will be apparent that modifications and variations are possible without departing from the scope of the invention defined in the appended claims.

What is claimed is:

1. Device for recognizing an impact site of a charge carrier beam on a target wherein X-rays emitted by the impact site are recognized, said device comprising: a first position-sensitive detector located at a first site; a first imaging system which detects all positions which the impact site can assume and produces a first image indicative of the impact site on a detector surface of said first position-sensitive detector, wherein the coordinates of said first image form a monotonic functional connection with the surface coordinates of the impact site and said first position-sensitive detector produces output signals which in turn depend monotonically on the surface coordinates of said first image of the impact site; a second position-sensitive detector (23) located a given distance from said first position-sensitive detector (22); a second imaging system which detects all positions which the impact site can assume and produces a second image indicative of the impact site on a detector surface of said second position-sensitive detector, wherein the surface coordinates of said second image form a monotonic functional connection with the surface coordinates of the impact site and said second position-sensitive detector produces output signals which in turn depend monotonically on the coordinates of said second image of the impact site; and an evaluation device to which the output signals of said first position-sensitive detector and said second position-sensitive detector are connected and which determines therefrom all three spatial coordinates of the impact site of the charge carrier beam.

2. Device as stated in claim 1, wherein surface coordinates which are contained in the output signals of said first and second position-sensitive detectors (22, 23) correlate with the X- and Y-coordinates of the impact site of the charge carrier beam, in the Cartesian system of coordinates (20), which extend essentially parallel to the surface of the target (26), and that in these output signals is contained a third coordinate which correlates to the z-coordinate of the impact site, in the Cartesian system of coordinates (20), which extends perpendicularly to the surface of the target (26).

3. Device as stated in claim 2, wherein said first position-sensitive detector and said second position-sensitive detector (22, 23) each generate four currents ($I_1$ to $I_4$ or $I_5$ to $I_8$ respectively) indicative of the surface coordinates of the impact site which are supplied as four currents ($I_1$ to $I_4$ or $I_5$ to $I_8$ respectively) to an evaluation circuit (45 or 46 respectively) of which each of said evaluation circuits makes available two output voltages ($U_{x1}$, $U_{y1}$ or $U_{x2}$, $U_{y2}$) which represent the surface coordinates of said first or second image of the impact site of the charge carrier beam, wherein one output voltage ($U_{x1}$) of the one evaluation circuit (45) and one output voltage ($U_{x2}$) of the other evaluation circuit (46) are supplied to a first sum former (47) as well as to a difference former (49) while the other output voltage ($U_{y1}$) of the one evaluation circuit (45) and the other output voltage ($U_{y2}$) of the other evaluation circuit (46) are supplied to a second sum former (48) and that an output signal ($U_x$) of the first sum former (47) is proportional to a first spatial coordinate (for example x) while an output signal ($U_y$) of the second sum former (48) is proportional to a second spatial coordinate (for example y) and an output signal ($U_z$) of the difference former (49) is proportional to a third spatial coordinate (for example z).

4. Device as stated in claim 1, wherein said first and second position-sensitive detectors (22, 23) are disposed above the target (26) and that between said detectors (22, 23) and the target (26) first and second pinhole diaphragms (24, 25) are located of which said first pinhole diaphragm (24) produces an image of the impact point (for example 29) on said first detector (22), and said second pinhole diaphragm (25) produces an image of the impact point (29) on said second detector (23).

5. Device as stated in claim 4, wherein the two diaphragms (24, 25) have in each instance the same normal distance (b) from the surface (27) of the target (26) as well as the same normal distance (a) to the sensor surfaces of the detectors (22 or 23 respectively) assigned to them.

6. Device as stated in claim 1, wherein the position-sensitive detectors in each instance are formed by combining in series two or more photosensors which taken per se have no position-sensitivity.

7. Device as stated in claim 1, wherein a vaporizer housing (51) is provided at which a detector (51) is provided via a holding mount (56, 57, 58).

8. Device as stated in claim 7, wherein said detector (50) has a position-sensitivity along a distinct direction in which the impact site (55) of the charge carrier beam (53) on the target is subject to fluctuations due to thermal and other effects.

9. Device as stated in claim 1, wherein the detectors (50) are provided in a housing (64) which at its front side has a diaphragm (67) which by means of a protective cap (62) is connected to the housing (64), and which at its rear side has a sensor carrier plate (74) which is pushed by means of a housing cover (76) against the housing (64).

10. Device as stated in claim 9, wherein a protective foil (69) is located between the diaphragm (67) and the protective cap (62).

11. Device as stated in claim 9, wherein the housing (64) on its periphery has a cooling channel (80) through which flows a coolant.

12. Device as stated in claim 9, wherein the sensor carrier plate (74) is disposed between the housing cover (76) and a holding means (73) and between this holding means (73) and a support sheet (72) a protective foil (71) is provided.

13. Device for recognizing an impact site of a charge carrier beam on a target wherein x-rays emitted by the impact site are recognized, said device comprising: a first position-sensitive detector which has position-sensitivities along the X-axis and supplies a first signal $U_{x1}$ independent of the X-radiation intensity; a second position-sensitive detector which has position-sensitivities along the Y-axis and supplies a second signal $U_{y1}$ independent of the X-radiation intensity; wherein said first and second signals depend in each instance exclusively on the coordinates x or y, respectively, of the impact point of the charge carrier beam on the target and are in particular independent of the coordinate z, if the impact point coincides with the intersection between a plane of symmetry perpendicular to the X-axis of a radiation-sensitive surface of the first detector and a plane of symmetry perpendicular to the Y-axis of a radiation-sensitive surface of the second detector and the target surface.

14. Device as stated in claim 13, wherein said first and second signals ($U_{x1}$ and $U_{y1}$), independent of the X-radiation intensity, are obtained from a ratio of output currents of said first position-sensitive detector and said second position-sensitive detector or from its logarithm.

15. Device for recognizing an impact site of a charge carrier beam on a target wherein X-rays emitted by the impact site are recognized, said device comprising:
   a first position-sensitive detector (22) located at a first site;
   a first imaging system which detects all positions which the impact site can assume and produces a first image indicative of the impact site on a detector surface of said first position-sensitive detector, wherein the coordinates of said first image form a monotonic functional connection with the surface coordinates of the impact site and said first position-sensitive detector produces output signals which in turn depend monotonically on the coordinates of said first image of the impact site;
   a second position-sensitive (23) detector located a given distance from said first position-sensitive detector (22), wherein said first and second position-sensitive detectors are disposed above the target (26);
   a second imaging system which detects all positions the impact site can assume and produces a second image on a detector surface of said second position-sensitive detector (23), wherein the surface coordinates of said second image form a monotonic functional connection with the coordinates of the impact site and said second position-sensitive detector produces output signals which depend monotonically on the coordinates of said second image of the impact site;
   a first pinhole diaphragm (24) located between said first and second position-sensitive detectors (22, 23) and the target (26);
   a second pinhole diaphragm (25) located between said first and second position sensitive detectors (22, 23) and the target (26);
   wherein said first pinhole diaphragm (24) produces an image of the impact point (29) on said first position-sensitive detector and said second pinhole diaphragm (25) produces an image of the impact point on said second position-sensitive detector (23);
   wherein a first imaginary straight line from the impact point (29) through an aperture (33) of said first pinhole diaphragm (24) leads to said first position-sensitive detector (22) while a second imaginary straight line from the impact point (29) through an aperture (34) of the second diaphragm (25) leads to said second position-sensitive detector (23);
   wherein a projection (31) of the first imaginary straight line into a plane defined by the coordinate axes X and Z forms an first angle ($\epsilon_1$) with a normal (30) of the target surface (27) while a projection (32) of the second imaginary straight line into the plane defined by the coordinate axes X and Z forms an second angle ($\epsilon_2$) with the normal (30); and
   an evaluation device to which the output signals of said first position-sensitive position detector and said second position-sensitive detector are supplied and which determines all three spatial coordinates of the impact site of the charge carrier beam.

16. Device as stated in claim 15, wherein a projection (31) of the first imaginary straight line into a plane defined by the coordinate axes Y and Z forms a third angle ($\delta_1$) with a normal (30) of the target surface while a projection of the second imaginary straight line into the plane defined by the coordinate axis Y and Z forms a fourth angle ($\delta_2$) with the normal (30).

17. Device as stated in claim 15, wherein said first and second position-sensitive detectors (22, 23) and said first and second pinhole diaphragms (24, 25) are disposed above the surface (27) of the target (26) in such a manner that when said first angle ($\epsilon_1$) is equal to said second angle ($\epsilon_2$) and said third angle ($\delta_1$) is equal to said fourth angle ($\delta_2$) the impact point (29) of the charge carrier beam is a specific, predetermined distinct point, for example the center point, on the surface (27) of the target (26).

18. Device as stated in claim 17, wherein a regulation arrangement is provided which on the basis of the determined coordinate voltages ($U_x$, $U_y$, $U_z$) deflects the charge carrier beam in such manner that said first angle ($\epsilon_1$) equals said second angle ($\epsilon_2$) and said third angle ($\delta_1$) equals said fourth angle ($\delta_2$) and, consequently the charge carrier beam is held at the specific, predetermined point on the surface (27) of the target (26).

19. Device for recognizing the impact site of a charge carrier beam on a target wherein the X-rays emitted by the impact site are recognized, said device comprising:
   a first position-sensitive detector (22) located at a first site;
   a second position-sensitive detector (23) having a given distance from said first position-sensitive detector (22) and producing output signals which depend monotonically on the coordinates of a second image of the impact site;
   an imaging system which detects all positions which the impact site can assume and projects images on a detector surface of said first and second position-sensitive detectors, wherein the image coordinates form a monotonic functional connection with the coordinates of the impact site and said first and second position-sensitive detectors produce output signals which depend monotonically on the coordinates of said images of the impact site;

an evaluation device to which the output signals of said first position-sensitive position detector (22) and said second position-sensitive detector (23) are supplied and which determines all three spatial coordinates of the impact site of the charge carrier beam; and wherein the radiation-sensitive surfaces of said first position-sensitive detector (22) and said second position-sensitive detector (23) lie in a plane which is parallel to a plane defined by the coordinate axes X and Y, wherein said first and second detectors (22, 23) have position-sensitivities along the X-axis and supply signals ($U_{x1}$ or $U_{x2}$), and that a signal ($U_z$), exclusively dependent on the Z-coordinate of the impact point (29) of the charge carrier beam on the target (26) is proportional to the ratio of two terms wherein a first term is formed from the difference of the signals ($U_{x1}$ and $U_{x2}$) and a second term from a first constant minus the difference of the signals ($U_{x1}$ and $U_{x2}$).

20. Device as stated in claim 19, wherein radiation-sensitive surfaces of said first and second detectors (22, 23) lie in a plane which is parallel to a plane defined by the coordinate axes X and Y, wherein said first and second detectors (22, 23) have position-sensitivities along the Y-axis and supply signals ($U_{y1}$ or $U_{y2}$), and that a signal ($U_z$) exclusively dependent on the Z-coordinate of the impact point (29) of the charge carrier beam on the target (26) is proportional to a ratio of two terms, wherein a first term is formed from the difference of the signals ($U_{y1}$ and $U_{y2}$) and a second term is formed from a second constant minus the difference of the signals ($U_{y1}$ and $U_{y2}$).

21. Device as stated in claims 19, wherein a signal ($U_x$) exclusively dependent on the X-coordinate of the impact point (29) of the charge carrier beam on the target (26) is proportional to a sum of two terms wherein the first term is formed from the product of a third constant with the sum of signals ($U_{x1}$ and $U_{x2}$) and a second term from the product of the signal ($U_z$) with the sum of signals ($U_{x1}$ and $U_{x2}$).

22. Device as stated in claim 19, wherein a signal ($U_y$), depending exclusively on the Y-coordinate of the impact point (29) of the charge carrier beam on the target (26), is proportional to the sum of two terms wherein a first term is formed from the product of a fourth constant with the sum of the signals ($U_{y1}$ and $U_{y2}$) and a second term from the product of signal ($U_z$) with the sum of signals ($U_{y1}$ and $U_{y2}$).

23. Device as stated in claim 19, wherein a signal ($U_z$), depending exclusively on the Z-coordinate of the impact point (29) of the charge carrier beam on the target (26), is proportional to the difference of the signals ($U_{x1}$ and $U_{x2}$).

24. Device as stated in claim 20, wherein a signal ($U_z$), depending exclusively on the Z-coordinate of the impact point (29) of the charge carrier beam on the target (26), is proportional to the difference of the signals ($U_{y1}$ and $U_{y2}$).

25. Device as stated in claim 19, wherein a signal ($U_x$), depending exclusively on the X-coordinate of the impact point (29) of the charge carrier beam on the target (26), is proportional to the sum of the signals ($U_{x1}$ and $U_{x2}$).

26. Device as stated in claim 20, wherein a signal ($U_y$), depending exclusively on the Y-coordinate of the impact (29) point of the charge carrier beam on the target (26), is proportional to the sum of the signals ($U_{y1}$ and $U_{y2}$).

* * * * *

UNITED STATES PATENT AND TRADEMARK OFFICE
CERTIFICATE OF CORRECTION

PATENT NO. : 5,051,599

DATED : September 24, 1991

INVENTOR(S) : Benes et al

It is certified that error appears in the above-identified patent and that said Letters Patent is hereby corrected as shown below:

Column 12, Line 54, "detector (51)" should be --detector (50)--.

Signed and Sealed this

Thirteenth Day of April, 1993

Attest:

STEPHEN G. KUNIN

*Attesting Officer*      *Acting Commissioner of Patents and Trademarks*